United States Patent [19]
Alter et al.

[11] Patent Number: 5,439,764
[45] Date of Patent: Aug. 8, 1995

[54] MASK HAVING MULTIPLE PATTERNS

[75] Inventors: Martin J. Alter, Los Altos; Lawrence R. Sample; Hiu F. Ip, both of San Jose; Marty E. Garnett, Los Gatos; Helmuth R. Litfin, Cupertino, all of Calif.

[73] Assignee: Micrel, Incorporated, San Jose, Calif.

[21] Appl. No.: 86,481

[22] Filed: Jul. 1, 1993

[51] Int. Cl.⁶ .............................................. G03F 9/00
[52] U.S. Cl. ...................................... 430/5; 430/320; 430/323; 430/394; 356/399; 356/401
[58] Field of Search .................... 430/5, 22, 320, 323, 430/394; 356/399, 401

[56] References Cited

U.S. PATENT DOCUMENTS 4,547,446 10/1985 Tam ........................................ 430/22
4,869,998 9/1989 Eccles et al. ............................ 430/5

FOREIGN PATENT DOCUMENTS 243060 9/1989 Japan .

Primary Examiner—S. Rosasco
Attorney, Agent, or Firm—Skjerven, Morrill, MacPherson, Franklin & Friel; Brian D. Ogonowsky; William L. Paradice, II

[57] ABSTRACT

One embodiment of the invention includes multiple patterns on a single mask, where all the patterns on the single mask are used for forming a single product. In the preferred embodiment, each of four quadrants of a mask have a different process layer pattern, where each of the four patterns is associated with a different process layer for the same product. After exposure of the wafer using the mask, the mask is rotated 90° for the next exposure step so that the mask pattern image for the next layer to be formed on the wafer will overlie the designated quadrant of the wafer which will contain the final product. Although, by using this technique, three-quarters of the wafer will be unusable, this partial waste of the wafer will be offset by the savings in mask costs with low volume production, in prototyping situations, and in product debugging. Using the above technique, conventional mask exposure machines may be used.

22 Claims, 3 Drawing Sheets

MASK HAVING MULTIPLE PATTERNS

FIELD OF THE INVENTION

This invention relates to masks used in the formation of integrated circuits and, in particular, to those mask types which contain the entire pattern to be formed on a semiconductor wafer in a single exposure step.

BACKGROUND OF THE INVENTION

An integrated circuit is formed, in part, by defining patterns in various layers grown or deposited on a semiconductor wafer surface. The patterned layers may, for example, define the doped regions in the wafer or the metal interconnections between the regions.

Typically, in forming the various layers on a semiconductor wafer to create an integrated circuit, the wafer is covered with a film of photoresist, and this photoresist layer is selectively exposed to radiation, such as ultraviolet radiation. If the photoresist is a negative photoresist, the exposed portions of the photoresist become hard and are not dissolved away in a subsequent developing process, while the unexposed portions of the negative photoresist are easily dissolved away during the developing process. If the photoresist is a positive photoresist, the exposed portions of the photoresist are easily dissolved away in the developing process, and the unexposed portions of the photoresist are insoluble in the developing solution.

The photoresist is exposed by interposing a mask between the radiation source and the wafer. The mask has an optically opaque pattern on it which corresponds to the pattern to be defined in the photoresist.

After exposure of the photoresist, the wafer is typically dipped in a developing solution for dissolving away the soluble portions of the photoresist to selectively expose the underlying layer. A next step in the wafer fabrication process may include doping, implantation, etching, oxidation, or any other process.

FIG. 1 illustrates a conventional prior art mask 10 of the type which contains the entire pattern to be formed in a photoresist layer on a wafer. A typical mask 10 contains a generally circular chrome pattern 12, which is larger than the wafer, where this chrome pattern 12 is formed on a square quartz substrate 14. The chrome portions of the pattern 12 are opaque to UV light. The chrome pattern 12 contains the entire pattern to be defined on the wafer's surface.

There are various ways to form chrome pattern 12 on quartz (or other transparent) substrate 14. One method is to form a solid chrome layer on quartz substrate 14, dispense a layer of photoresist over the chrome layer, then selectively expose the photoresist to light to define the mask pattern. The photoresist may be selectively exposed using a 5X or 10X reticle having one or more enlarged die patterns formed on it. The reticle is then stepped and repeated across the photoresist surface to define the mask pattern. The photoresist layer is then developed, and the exposed underlying chrome layer is then etched to form the pattern 12 in FIG. 1.

Another way to form the chrome pattern 12 is to form a layer of chrome on the quartz substrate 14 and use a scanning electron beam to selectively etch away portions of the chrome layer. The electron beam is controlled by a computer which is programmed with the desired mask pattern.

The mask 10 of FIG. 1 may be used in a projection-type exposure system or a contact-type exposure system where the mask is placed in direct contact with the wafer surface.

The typical cost for a single mask 10 is approximately $1,000, and there may be as many as twelve or more masks used for forming an integrated circuit product. When developing and testing a product, frequently masks must be modified so that multiple versions of the same mask may be required before achieving a final design. If only a relatively few numbers of chips are required to meet the consumers' needs, the costs of these masks become a significant portion of the product's manufacturing cost.

One way which has been used in the past to limit the costs of masks for a product is illustrated with respect to FIG. 2. In FIG. 2, a single mask 20 is fabricated which contains two or more patterns for concurrently forming two or more patterns on a wafer surface in a single exposing step in order to form two or more products on the same wafer. The mask 20 of FIG. 2 illustrates three different chrome patterns 22, 23, 24 formed on the same mask 20 for forming three different products on the same wafer. After the wafer is completely processed, the wafer is tested and diced, and the dice for the three products are separated out and packaged.

An advantage of the mask of FIG. 2 is that only one-third of the masks are required to form the three products, which would save approximately $24,000, assuming each product required twelve exposing steps.

The main problem with mask 20 of FIG. 2 is that rarely are three product mask designs finalized at the same time. For example, the final design for product 3, formed using pattern 24 in FIG. 2, may be late to finish, which would delay the introduction of products 1 and 2, formed using mask patterns 22 and 23. This would be a serious problem in today's fast-paced electronics industry. Accordingly, the mask of FIG. 2 and similar type mask designs are not useful when products must be introduced in a timely fashion.

Also, using mask 20, significant delays will often occur since, if one layer needs to be modified on one product, the economical designer will wait until it is assured that the other products will not need changes on the same layer.

Further, by using mask 20 of FIG. 2, if there is a need to change the mask pattern for one of the products, another mask must be fabricated, and this could undesirably cause slight variations in the other mask patterns due to variances in the mask formation process.

Still further, mask 20 of FIG. 2 is not suitable for production runs since the demands for one of the products 1, 2, and 3 may change, while the same relative quantities of the products 1, 2, and 3 must keep being produced using the fixed mask pattern of FIG. 2.

Additionally, if products 1, 2 and 3 do not use the same technologies (e.g., CMOS, bipolar, etc.), this may greatly complicate the wafer fabrication process. Similarly, if the various products 1, 2 and 3 require different line widths or contact hole sizes, this may additionally complicate the wafer fabrication process.

Thus, the general mask type of FIG. 2 has only limited usefulness.

The most common and inexpensive types of exposure systems use the wafer-size masks of FIGS. 1 or 2, where the full mask image completely covers the wafer without any stepping of the mask image across the wafer. The exposure systems which utilize such masks may automatically align the masks with respect to a reference target on the wafer surface, or the alignment may be made manually by an operator using a microscope. Thus, for typical integrated circuits, such conventional alignment and exposure systems, whether projection or contact mask systems, are desirable to produce relatively inexpensive chips. For smaller wafer fabrication facilities, the large expense of buying state of the art step-and-repeat exposure systems, which step a reticle across the wafer surface to expose the photoresist layer, is not justified for the volume of chips produced.

Thus, what is needed is a new type of mask configuration and photoresist exposure method which limits the costs of masks used for forming integrated circuits and which can make use of the relatively inexpensive, conventional projection or contact exposure systems.

SUMMARY OF THE INVENTION

One embodiment of the invention includes multiple patterns on a single mask, where all the patterns on the single mask are used for forming a single product. In the preferred embodiment, each of four quadrants (corners) of a mask have a different pattern, where each of the four patterns is associated with a different layer for the same product. After exposure of the wafer using the mask, the mask is rotated 90° for the next exposure step so that the mask pattern image for the next layer to be formed on the wafer will overlie the designated quadrant of the wafer which will contain the final product. Although, by using this technique, three-quarters of the wafer will be unusable, this partial waste of the wafer will be offset by the savings in mask costs with low volume production and by the ability to prototype and debug new products more quickly.

Using the above technique, conventional mask exposure machines may still be used.

This mask concept may also be used to provide multiple variations of a same layer for experimentation and testing purposes, or may provide for different metallization layers for programming ASICs or other types of gate arrays. Numerous other advantages also flow from this concept.

DETAILED DESCRIPTION OF THE PREFERRED EMBODIMENTS

Figure 3:
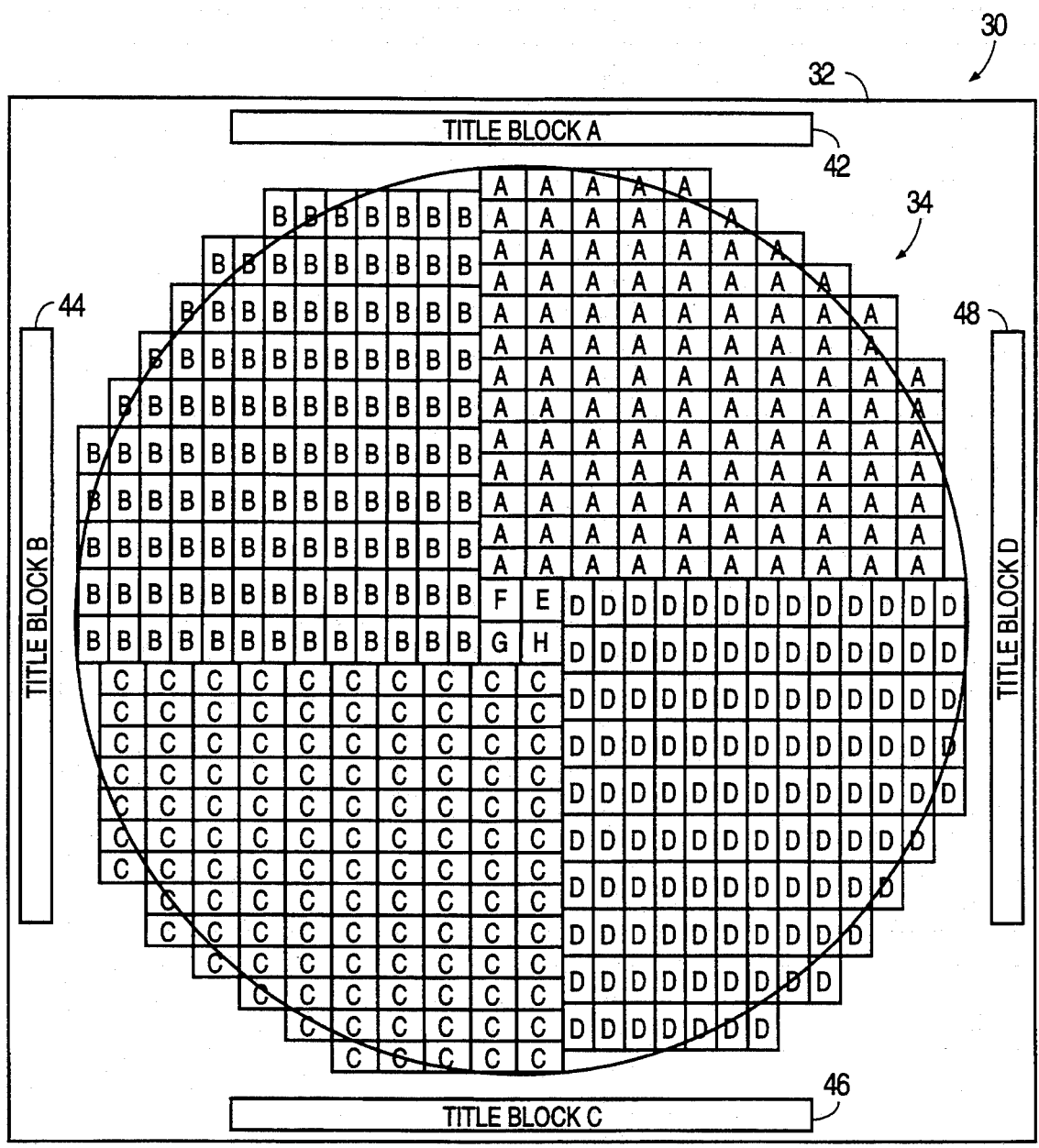
FIG. 3 is a top view of a preferred embodiment mask in accordance with the present invention.

FIG. 3 is a top view of a mask in accordance with the preferred embodiment of the invention. Mask 30 consists of a conventional, transparent quartz substrate 32 having a chrome layer formed thereon which has been selectively etched away to form a generally circular mask pattern 34. Although chrome is used in the preferred embodiment, other layers which are substantially opaque to the intended radiation wavelength (e.g., UV) may also be used.

In the preferred embodiment, the chrome layer is selectively etched to form mask pattern 34 using a scanning electron beam controlled by a computer programmed with the mask pattern shown in FIG. 3.

The outer dimensions of mask 30 in one embodiment are 5×5 inches, where the circular mask pattern 34 has a diameter of approximately 4 inches so as to be slightly larger than a wafer to be processed.

Each quadrant of mask pattern 34 contains one of four different patterns consisting of pattern A, pattern B, pattern C, and pattern D. Each pattern corresponds to a process layer of a single product so that mask 30 would be used to expose four process layers of one product. Each of the quadrants are shown divided up into identical, small rectangular sections, each section in a quadrant being associated with a single die. In one embodiment, the size of each rectangular section is approximately 5380×3480 microns.

Four additional patterns E, F, G, and H are formed in the central portion of mask pattern 34 and are used to form a test pattern consisting of selected components or circuits on the wafer for testing various parameters of the resulting circuitry. Such a test pattern formed on the wafer using patterns E, F, G, and H would be the same for many different types of products to standardize characterization of the wafers. For simplicity, these test patterns E, F, G, and H will be ignored for now.

Figure 4:
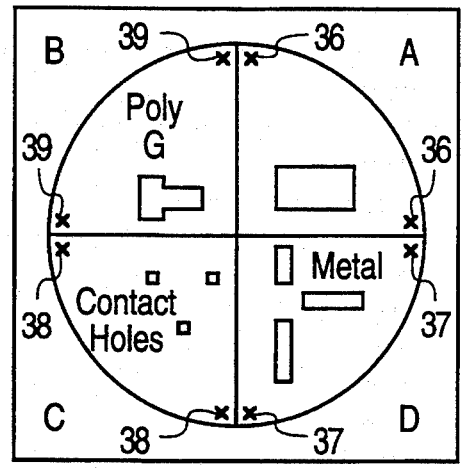
FIG. 4 provides a simplified example of the various patterns which may be contained on the mask of FIG. 3.

In one embodiment, each of the quadrant patterns A, B, C, and D are used for defining a layer in a single integrated circuit product, as illustrated in the example of FIG. 4.

FIG. 4 provides an indication of what types of layers may be defined by each of the patterns A–D. In the example of FIG. 4, pattern A defines where the silicon surface of the wafer will be exposed for forming active area regions; pattern B defines where a polysilicon layer will be formed to result in gates between source and drain regions of the active area; pattern C defines where an oxide layer will be etched away to form contact holes for contacting the various active areas and gates; and pattern D defines the etching of a metal layer for interconnecting the various active areas and gates.

As illustrated in FIG. 4, alignment targets 36, 37, 38 and 39 are formed in each quadrant of the mask pattern 34, or within each die pattern, to enable alignment of the mask pattern 34 with respect to reference targets on the wafer surface. These targets are well known and are not illustrated in the example of FIG. 3 for simplicity.

A simplified integrated circuit fabrication method using the mask 30 of FIG. 3 will now be described.

As a first step, a silicon wafer, already having a protective layer of nitride formed on it, has a layer of photoresist spun on and is inserted into a conventional exposure system, such as a Perkin-Elmer projection aligner or a Canon contact type aligner. Mask 30 of FIG. 3 is inserted into the exposure system so that title block 42 is oriented in a predetermined direction in the exposure system.

UV radiation is then passed through mask 30 to expose the complete wafer with the pattern 34 shown in FIG. 3. The photoresist layer on the resulting wafer is then developed to remove the portions of the resist exposed to the UV radiation, assuming a positive photoresist. Portions of the nitride layer on the silicon wafer surface are now exposed for defining the active areas.

The wafer is then subjected to an implant and field oxidation step for forming the various active areas, such as source and drain regions, within the wafer.

A layer of gate oxide followed by a layer of polysilicon may then be formed over the wafer, ultimately followed by another layer of photoresist. The wafer is then reinserted into the exposure system in its previous orientation. Mask 30 is now rotated clockwise 90° and inserted into the exposure system so that the title block 44 is now oriented in the same direction that the title block 42 was oriented in the previous exposure step. The image of pattern B on the wafer will now overlap the pattern A previously defined on one quadrant of the wafer.

The photoresist layer is then exposed and developed. The revealed polysilicon layer is then etched so that regions remain which will form the various gates.

A suitable layer of oxide or other insulating material may then be formed or deposited over the wafer, and another photoresist layer is spun on. The wafer is then reinserted into the exposure system, and mask 30 is again rotated 90° clockwise so that the pattern C image now overlaps the patterns A and B already formed on one quadrant of the wafer. The operator will see the title block 46 now oriented in the proper direction. In the example of FIG. 4, exposure of the wafer through pattern C, followed by an etching step, forms contact holes in the insulating material to contact the various sources, drains, and gates formed in one quadrant of the wafer.

In the example of FIG. 4, a metal layer is then deposited over the wafer surface, and a photoresist layer is spun on the surface of the metal layer. The wafer is reinserted into the exposure system, and mask 30 is again rotated 90° clockwise. The title block 48 will now be oriented in the proper direction. The pattern D image now overlaps the patterns A, B, and C previously formed on one quadrant of the wafer. Exposure and developing of the photoresist reveals portions of the metal layer to be etched. After the metal layer is etched, the proper interconnection between the various regions and gates on the wafer are now formed.

The above simplified process will form the desired integrated circuits in only the single selected quadrant of the wafer. A single test pattern area, formed using the combination of patterns E, F, G and H, will also be formed in the wafer near the center of the wafer. The wafer is then sawed to separate the operable dice, and the remaining three-quarters of the wafer is disposed of.

In an actual embodiment, more than four patterns are required to form an operational product. Thus, a number of masks 30, each having a different combination of four patterns, would typically be used to form a product. In a typical embodiment, twelve patterns would be needed to form an operational product, and, thus, three of masks 30 would be used to form a single product.

Although not typically practical, the wafer may be rotated 90°, instead of mask 30, for each of the above exposure steps.

An alternative embodiment of mask 30 contains only two patterns, where a first pattern is located in the upper one-half portion of the circular mask pattern, and a second pattern is located in the lower one-half portion of the mask pattern. The mask would then be rotated 180° between exposure steps. Thus, two masks would then be required to provide patterns A, B, C, and D.

Mask 30 is especially advantageous for use in conventional projection or contact exposure equipment, since these conventional systems allow the rotation of the square mask 30 within the mask receptacle. Since these conventional exposure systems are not intended for use with masks having multiple patterns, these conventional exposure systems only have the capability to shift the mask by about 90 mils in order to align the mask with previous patterns on the wafer. Since mask 30 only needs to be rotated and then conventionally aligned with respect to the wafer, this allows mask 30 to be used with the conventional exposure equipment.

Mask 30 is particularly useful when introducing limited quantities of a product for sampling, since the initial introduction cost is kept low by minimizing the number of masks needed to form the product. However, since only one-quarter of the wafer will produce usable dice, mask 30 is not very beneficial for high volume production. Once it is established that the sampled product, formed using the multi-pattern mask 30, will require volume production and the product design has been thoroughly debugged and optimized, then the expenditure in providing the conventional masks of FIG. 1 for forming the product will be justified.

To maximize the cost advantages of mask 30, the combination of patterns A, B, C, and D on a same mask should be chosen so that mask patterns which typically need revision during a development stage, or which are related, are located on a same mask 30. For example, the metallization pattern and contact hole pattern masks are related such that if one needs to be revised, the other one would most likely also have to be revised. Therefore, the metal pattern and the contact hole pattern are preferably included on a same mask 30. This minimizes the costs of development masks.

In the preferred embodiment shown in FIG. 3, each of the patterns A, B, C, and D slightly overlap an adjacent quadrant on the mask pattern 34. This is to accommodate those conventional exposure systems of the type where the operator manually aligns the mask with respect to the wafer while viewing the mask and underlying wafer through a two-eyepiece microscope. Many of these microscopes have a left eyepiece which can only view a left half of a mask and a right eyepiece which can only view the right side of a mask. The particular pattern sizes shown in FIG. 3 allow the operator to view all portions of a single pattern A, B, C, or D through both eyepieces of the microscope. This aids the operator in aligning the mask pattern with the wafer.

Figure 5:
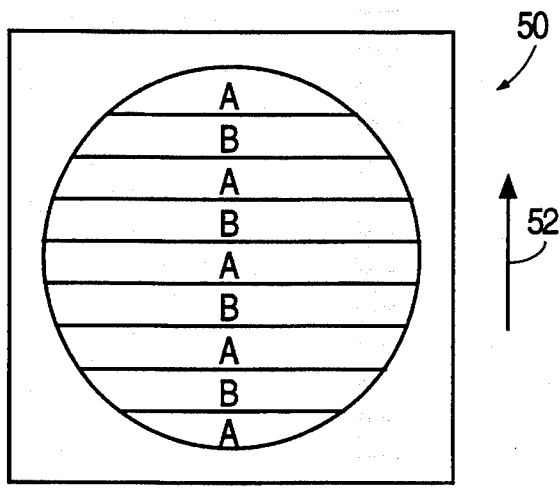
FIG. 5 is a top view of another mask which utilizes certain concepts of the present invention.

In another embodiment, using the concepts of this invention, mask 50 of FIG. 5 contains two patterns for defining two layers on a same product, where these patterns alternate between pattern A and pattern B on the mask. Using mask 50, one-half of the wafer would be wasted since only one-half of the wafer would have the patterns A and B arranged on the wafer in the proper order.

In one example of using mask 50 of FIG. 5, a first layer of photoresist is exposed by mask 50. The photoresist layer is then developed, and an appropriate doping, implantation, diffusion, deposition, or etching step is then conducted. A next layer of photoresist is then spun on, and the mask 50 is shifted up in the direction shown by arrow 52 by the width of a single one of the patterns A or B so that the pattern B image will now overlie the corresponding pattern A previously formed on the wafer. The wafer surface is then exposed to radiation through the shifted mask 50. The alternate portions of the wafer which have the patterns formed in the order A-B are the usable portions.

For a next pattern to be defined on the wafer, a new mask must be used which contains, for example, patterns C and D.

Mask 50 has a drawback, however, since conventional exposure systems are not designed to shift a mask in any direction beyond a reasonable alignment tolerance, such as 90 mils. Hence, if the width of pattern A or B in FIG. 5 is greater than 90 mils, mask 50 could not be shifted in the direction of arrow 52 sufficiently to overlap a pattern B image with the pattern A previously formed on the wafer. Accordingly, the mask 50 is limited to smaller die sizes and generally limited to only containing two patterns.

An additional use of the masks described with respect to FIGS. 3 and 5 is to form each of the patterns A–D (FIG. 3) or A and B (FIG. 5) on a single mask as a variation of the other patterns on the same mask, where only one of the patterns would be used for a certain product variation. For example, pattern A in FIGS. 3 or 4 may be a metal layer pattern for interconnecting gates in a gate array to form a first product, while pattern B may be a second metal layer pattern used for interconnecting different gates of the same gate array for forming a second product.

Patterns C and D in FIG. 3 may be any pattern including a third metal layer pattern or other pattern for forming the gate array.

Additionally, during development of a product, certain variations in patterns may be desired to test which variation produces the best results. In the case of FIG. 3, pattern A may be used in forming a first product variation, and pattern B may be used, instead of pattern A, to form a second product variation. The performance of the first product and second product may then be compared. In this manner, only a single mask need be formed and purchased for providing up to four variations of a single layer for one or more products. Other uses would be apparent to those skilled in the art after reading this disclosure.

Another option is to create patterns A, B, C, and D in FIG. 3 such that each pattern on mask 30 would be used for forming a layer on a different product, or one combination of patterns would be used for one product and a different combination would be used for another product. This particular use of the concept embodied in the mask 30 of FIG. 3 suffers from the previously described drawbacks relating to development delays when using a single mask to form a number of different products. However, there are situations when this use may still be desirable, such as with small-dice products using similar technology.

Figure 1:
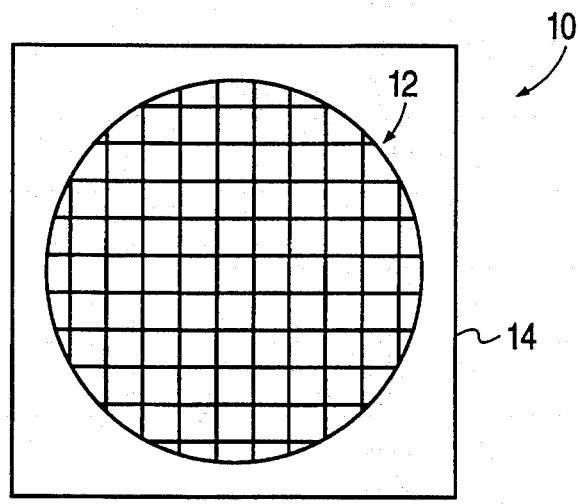
FIG. 1 illustrates a top view of a conventional mask for exposing an entire surface of a wafer.
Figure 2:
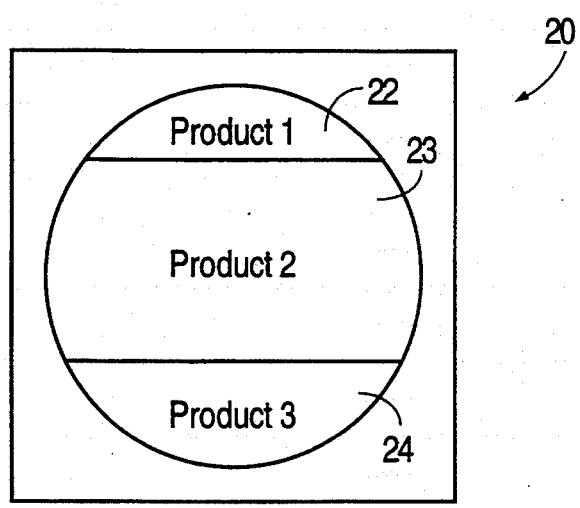
FIG. 2 illustrates the mask of FIG. 1 having three different patterns for forming three different products.

Additionally, the multi-pattern masks of FIGS. 3 or 5 can be used in conjunction with the production masks of the type shown in FIG. 1 while still achieving the benefits described above. This may be particularly useful, for example, with ROM codes or metal hookups for gate arrays. In this case, four pattern options can be formed on one mask 30 and the mask 30 then used to expose wafers fabricated using conventional masks like in FIG. 1. Once a preferred pattern on the mask 30 is selected, a FIG. 1 type ROM or metal mask could then be implemented later when the volume justifies it.

A preferred and alternate embodiment of the invention has been shown with respect to FIGS. 3 and 5. The masks described with respect to these embodiments save considerable cost in developing new products for sampling or for other small volume requirements.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A mask structure for selectively exposing a photoresist layer on a semiconductor wafer surface to radiation, said mask structure comprising:
   a first section containing an array of identical adjacent first mask patterns for selectively exposing a first section of said wafer to said radiation when said mask structure is in a first position relative to said wafer; and
   a second section containing an array of identical adjacent second mask patterns, said second mask patterns being different from said first mask patterns, for selectively exposing said first section of said wafer to said radiation when said mask structure is in a second position relative to said wafer, wherein each of said first mask patterns and each of said second mask patterns are for forming a pattern on a single integrated circuit.

2. The mask structure of claim 1 wherein said first mask patterns and said second mask pattern are formed on said mask structure so that an image of said first mask patterns impinges upon said first section of said wafer when said mask structure is interposed between a source of said radiation and said wafer and, when said mask structure is rotated through a predetermined angle relative to said wafer, an image of said second mask patterns impinges upon said first section of said wafer when said mask structure is interposed between said source of said radiation and said wafer.

3. The mask structure of claim 2 wherein said predetermined angle is 90°.

4. The mask structure of claim 2 wherein said predetermined angle is 180°.

5. The mask structure of claim 2 wherein said predetermined angle is 270°.

6. The mask structure of claim 2 wherein said first section of said mask structure is a first quadrant of said mask structure and said second section of said mask structure is a second quadrant of said mask structure, and wherein said first section of said wafer is a single quadrant of said wafer.

7. The mask structure of claim 6 further comprising an array of identical adjacent third mask patterns and an array of identical adjacent fourth mask patterns wherein said first mask patterns are contained in a first quadrant of said mask structure, said second mask patterns are contained in a second quadrant of said mask structure, said third mask patterns are contained in a third quadrant of said mask structure, and said fourth mask patterns are contained in a fourth quadrant of said mask structure, each of said first, second, third, and fourth mask patterns being different from the other, wherein each of said first, second, third, and fourth mask patterns are for forming a pattern on a single integrated circuit.

8. The mask pattern of claim 7 wherein each of said first mask patterns, second mask patterns, third mask patterns, and fourth mask patterns overlap into an adjacent quadrant of said mask structure.

9. The mask structure of claim 1 wherein said first mask patterns and said second mask patterns define patterns to be formed in two or more photoresist layers for forming a single integrated circuit product, said first mask patterns and said second mask patterns being required in the formation of said single integrated circuit product.

10. The mask structure of claim 9 wherein said first mask patterns and said second mask patterns are variations on a same layer defined on said wafer.

11. The mask structure of claim 1 wherein said first mask patterns are used in the formation of a first integrated circuit product, and said second mask patterns are used in the formation of a second integrated circuit product.

12. The mask structure of claim 1 wherein said first mask patterns and said second mask patterns are formed on said mask structure so that an image of said first mask patterns impinges upon said first section of said wafer when said mask structure is interposed between the source of said radiation and said wafer and, when said mask structure is shifted a predetermined amount relative to said wafer, an image of said second mask patterns impinges upon said first section of said wafer when said mask structure is interposed between said source of said radiation and said wafer.

13. The mask structure of claim 12 wherein said predetermined amount is approximately equal to or less than 90 mils.

14. The mask structure of claim 12 wherein said first mask patterns and said second mask pattern alternate along a surface of said mask structure.

15. A method for forming integrated circuit devices comprising the steps of:

positioning a mask structure in a first relative position between a radiation source and a semiconductor wafer so that an array of identical adjacent first patterns formed on said mask structure causes a corresponding image to impinge on a first section of said wafer to selectively expose said first section to said radiation; and positioning said mask structure in a second relative position between said source of radiation and said wafer so that an array of identical adjacent second patterns, different from said first patterns, formed on said mask structure causes a corresponding image to impinge on said first section of said wafer to selectively expose said first section to said radiation.

16. The method of claim 15 wherein said step of positioning said mask structure in said second relative position comprises rotating said mask structure through a predetermined angle relative to said wafer.

17. The mask structure of claim 16 wherein said predetermined angle is 90°.

18. The mask structure of claim 16 wherein said predetermined angle is 180°.

19. The method of claim 15 wherein said first patterns on said mask structure reside in a first quadrant of said mask structure and said second patterns on said mask structure reside in a second quadrant of said mask structure, and wherein said first section of said wafer is a single quadrant of said wafer.

20. The method of claim 15 wherein said first mask patterns and said second mask patterns define patterns to be formed in two or more photoresist layers for forming a single integrated circuit product, said first mask patterns and said second mask patterns being required in the formation of said single integrated circuit product.

21. The method of claim 15 wherein said first mask patterns are used in the formation of a first integrated circuit product, and said second mask patterns are used in the formation of a second integrated circuit product.

22. The method of claim 15 wherein said first mask patterns and said second mask patterns are two pattern variations for a same layer to be defined on said wafer.

* * * * *